(12) United States Patent
Marbot et al.

(10) Patent No.: US 6,476,615 B1
(45) Date of Patent: Nov. 5, 2002

(54) DEVICE FOR TESTING DYNAMIC CHARACTERISTICS OF COMPONENTS USING SERIAL TRANSMISSIONS

(75) Inventors: Roland Marbot, Sassenage (FR); Pascal Couteaux, Grenoble (FR); Reza Nezamzadeh, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/258,476

(22) Filed: Feb. 26, 1999

(30) Foreign Application Priority Data

Feb. 27, 1998 (FR) .............................. 98-02401

(51) Int. Cl.$^7$ .............................. G01R 23/02
(52) U.S. Cl. .................... 324/537; 324/76.59; 375/224; 375/259
(58) Field of Search ................. 375/224, 259, 375/354, 362, 358; 324/537, 616, 617, 539, 543, 76.59; 3710/289, 315

(56) References Cited

U.S. PATENT DOCUMENTS

| | | | | |
|---|---|---|---|---|
| 4,267,590 A | * | 5/1981 | Bosotti | 359/133 |
| 4,896,318 A | * | 1/1990 | Kokubo et al. | 370/289 |
| 5,107,488 A | * | 4/1992 | Schreder et al. | 370/315 |
| 5,119,402 A | * | 6/1992 | Ginzburg et al. | 375/257 |
| 5,327,031 A | * | 7/1994 | Marbot et al. | 327/276 |
| 5,481,563 A | | 1/1996 | Hamre | |
| 5,640,401 A | | 6/1997 | Yamada | |
| 6,008,655 A | * | 12/1999 | Kuroda | 324/537 |

FOREIGN PATENT DOCUMENTS

WO    WO 97/02493    1/1997

OTHER PUBLICATIONS

French Search Report with Annex (Nov. 25, 1998) FR 9802401.

* cited by examiner

Primary Examiner—N. Le
Assistant Examiner—Vincent Q. Nguyen
(74) Attorney, Agent, or Firm—Lisa K. Jorgenson; Stephen Bongini; Fleit, Kain, Gibbons, Gutman & Bongini P.L.

(57) ABSTRACT

A testing device for testing dynamic characteristics of an electronic circuit using serial transmissions. The circuit includes a multiplexing device and a demultiplexing device for implementing a serial link in the component or circuit. The testing device includes a transmitter for transmitting binary signals to the multiplexing device, a receiver for receiving binary signals from the demultiplexing device, and a link for selectively providing a coupling between the transmitter and the receiver. Additionally, a clock generator delivers a first clock signal to the transmitter and a second clock signal, which has a different frequency than the first clock signal, to the receiver. In one preferred embodiment, the clock generator includes a single programmable-frequency oscillator and a variable delay circuit. The programmable-frequency oscillator delivers the first clock signal and the variable delay circuit delays the first clock signal to deliver the second clock signal. The testing device can be used with circuits operating at frequencies in the range of 100 MHz. A method of testing dynamic characteristics of an electronic circuit using a testing device is also provided.

21 Claims, 4 Drawing Sheets

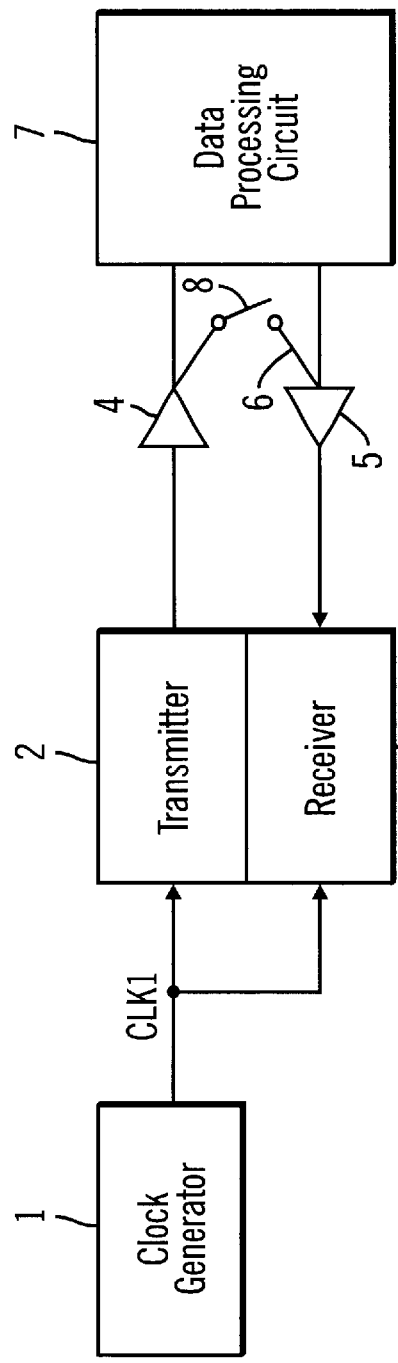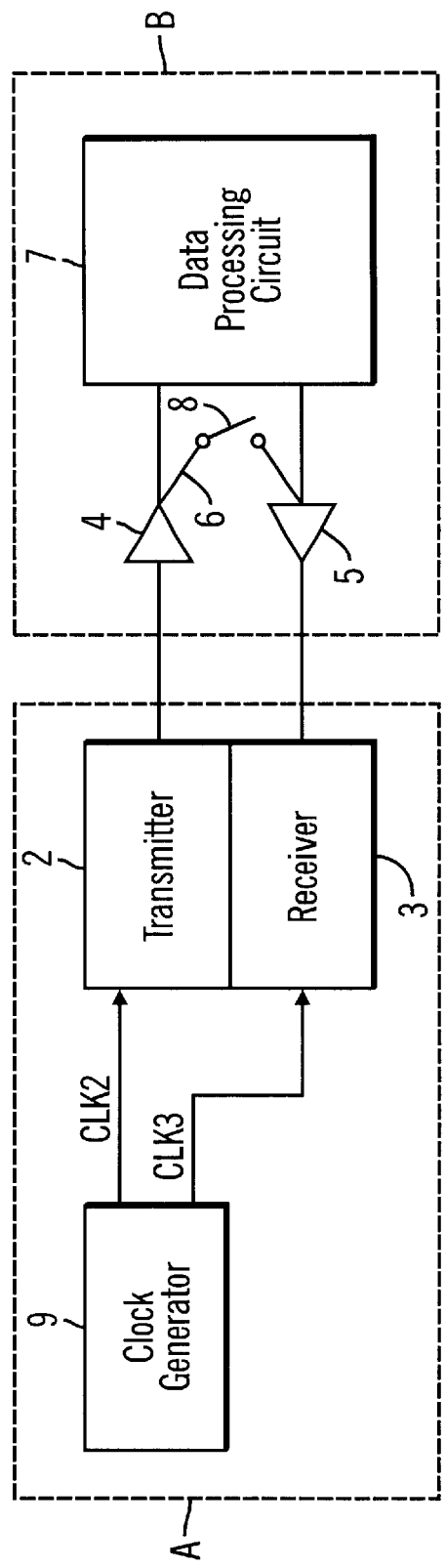

DEVICE FOR TESTING DYNAMIC CHARACTERISTICS OF COMPONENTS USING SERIAL TRANSMISSIONS

CROSS-REFERENCE TO RELATED APPLICATIONS

This application is based upon and claims priority from prior French Patent Application No. 98-02401, filed Feb. 27, 1998, the entire disclosure of which is herein incorporated by reference.

BACKGROUND OF THE INVENTION

1. Field of the Invention

The present invention relates to testing of dynamic characteristics of components or circuits using serial transmissions, and more specifically to evaluating the resistance of components or circuits in the face of frequency dispersion and frequency fluctuations.

2. Description of Related Art

The phenomena of frequency dispersion corresponds to a frequency shift observed between different quartz crystals of the same nominal frequency. The sources of this shift are often inherent in the components of the circuit. Further, frequency fluctuations usually have causes that are external to the circuit, but may also come from the circuits itself. The frequency fluctuations are expressed as low random frequency variations between the received and transmitted signals. This phenomenon is commonly known as "jitter". Frequency dispersion and frequency fluctuations must be taken into account when transmitting data.

There are two major types of wired transmission between a transmitter and a receiver. First, there is parallel transmission which is characterized by the sending of information in the form of binary signals and a clock signal with the information being sent on different links between the transmitter and the receiver. At the receiver, the information elements are sampled by the clock signal. There is a major frequency limitation with this type of transmission because the information does not reach the receiver simultaneously. Thus, it is necessary to wait for all information elements of a first group of transmitted data elements to reach the receiver before sending the next group of data. The difference in transit times between the different data signals and the clock is inherent in this type of communication and is commonly known as "skew".

The second mode of wired transmission is serial transmission which is characterized by the sending of information containing data to be transmitted and the clock signal as a single signal. The single signal must simultaneously convey data information and clock information. At the receiver, the clock signal must be extracted from the received bit train and then the clock signal is used to sample the data contained in the same bit train. Consequently, the frequency limitation with serial transmission (i.e., the skew) dictated by parallel transmissions is eliminated so it is possible to transmit data on a single wire at far higher bit rates. Thus, the link, which may be either a copper cable or optical fiber having an inelastic cost, is made more economical.

However, a serial link also has a frequency limitation that is essentially caused by two phenomena. First, any link dictates a frequency limitation of the signals that it conveys because of its passband. Beyond certain frequencies, the attenuation of signals in the cables is far too great for the transmitted information to be exploited in the receivers. Further, each element that plays a role in the link introduces and is subject to frequency disturbances. This phenomenon may come from the transmitter itself, from carriers of the link (whether it is a copper cable or optical fiber) or from electrical noise. However, when a parallel link can operate at 100 MHZ, a serial link typically can operate at several megabits per second.

The key to implementing economically viable serial links is use components known as multiplexing devices and demultiplexing devices in lowcost components. By means of multiplexing devices, data that has to be transmitted can be let through on only one wire. The demultiplexing devices can be used to recover the clock signal in the series signal and demultiplex the data received. Such components (i.e., those developed by SGS THOMSON under the references FC106, GE105, and SBPH400-3 often raise a large number of problems, especially with respect to production tests. Indeed, no integrated circuit tester on the market can be used to probe or generate signals in the transmission speed range of gigabits ($10^9$ bits) per second.

Thus, the component must be provided with a self-testing device that must include an internal oscillator activating the circuit in its range of operation, and a data generator such as a pseudo-random generator. The data elements are sent in the form of binary signals to the multiplexing device, which converts them into a series signal. The component, in self-testing mode, must send the series signal to the input of the demultiplexing device, which will recover the clock signal and demultiplex the binary signal. The recovered binary signals are then sent to a logic circuit, which verifies their conformity and detects and counts any errors. Thus, by initializing the circuit in self-testing mode, allowing it to work independently for a few milliseconds, and then re-reading the error counter, it is possible to test the operation of a component on any low frequency tester. This type of testing can be applied at both the integrated circuit level and the assembled circuit (or package level).

FIG. 1 shows a schematic diagram of such a self-testing device. A clock generator 1 provides a clock signal CLK1 to both a transmitter 2 and a receiver 3. The output of the transmitter 2 is supplied to a multiplexing device 4 and a demultiplexing device 5 is connected to an input of the receiver 3. The multiplexing device 4 delivers a signal to the input of a data processing circuit 7 that sends a signal to the demultiplexing device 5. A link 6 controlled by a switch 8 directly loops the output of the multiplexing device 4 to the input of the demultiplexing device 5. In normal operation, the link 6 is open and is not used. The link 6 is used in the context of the self-test.

This self-testing technique is highly efficient. However, it cannot be used to test all the dynamic characteristics of the component because it does not correspond to the real use conditions of the component. In a real application, the components communicating with one another through the serial link are activated by clocks whose signals are generated by quartz crystal oscillators of the same nominal frequency. However, these quartz crystal oscillators inevitably have frequency dispersions (typically of 100 ppm), and the component must compensate for these frequency dispersions. The self-test generator activates the transmitter and receiver with the clock signal generated by the internal oscillator alone. This is the ideal case in which frequency dispersions are absent and is far from practical environments.

Furthermore, the real use conditions are also not met because the link between the transmitter and the receiver is internal to the component, and thus subjected to very little disturbance. Thus, this technique does not make it possible to measure the robustness of the link in the face of external frequency fluctuations. The self-testing technique is known for testing components that integrate serial links. At the present time, the limitations of such testing are circumvented to an approximate extent by sampling components, mounting them on cards, and carrying out more extensive tests on the samples. However, these tests represent a significant production cost and do not cover all of the components.

SUMMARY OF THE INVENTION

In view of these drawbacks, it is an object of the present invention to remove the above-mentioned drawbacks and to provide a system that presents a solution to these testing problems. The system makes it possible to test the robustness of each component in the face of frequency dispersions and frequency fluctuations in the self-testing mode. Therefore, it is possible to obtain an exhaustive characterization of the dynamic performance characteristics of the components at a cost compatible with the constraints of mass production. The main constraints are that it is still difficult to generate an external clock signal capable of having a flow rate of about one gigahertz, and even if it were possible to make such a clock signal, it would be necessary to generate two clock signals with slightly different periods, on the basis of this single clock signal, to be able to observe the drift between the edges of the clock signal given to the transmitter of the circuit with respect to the edges of the clock signal given to the receiver of the circuit.

In the component, two clock signals are generated instead of one. A first clock signal is used for the multiplexing device and a second clock signal is used for the demultiplexing device. The two clock signals have very substantially different frequencies, and this frequency difference can be constant to set up a model of the frequency dispersion of the quartz crystal oscillator. The frequency difference can also be variable to set up a model of the effect of frequency fluctuation on the line. The pseudo-random variations in the frequency of the transmitter clock signal give rise to variations in the identical generated series signal that are similar to uncontrolled frequency fluctuations. By controlling this frequency difference, it is possible to measure the resistance of the component to frequency dispersions and frequency fluctuations. For this purpose, it is enough to gradually increase the frequency difference and raise the threshold from which the self-testing circuit detects transmission errors.

One embodiment of the present invention provides a device for testing dynamic characteristics of an electronic component or circuit using serial transmissions. The component or circuit includes a multiplexing device and a demultiplexing device that implement a serial link in the component or circuit. The testing device includes a transmitter for providing the multiplexing device with data elements to be multiplexed, a receiver for receiving the multiplexed data elements from the output of the demultiplexing device, and a link that provides a coupling between the output of the multiplexing device and the input of the demultiplexing device. Additionally, the testing device includes a device for delivering a first clock signal and a second clock signal, with the first clock signal being supplied to the transmitter and the second clock signal being supplied to the receiver. The first clock signal and the second clock signal have different frequencies. Thus, it is possible to observe the robustness of the component in the face of frequency dispersions and frequency fluctuations. A method of testing dynamic characteristics of an electronic circuit using a testing device is also provided.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 is a block diagram showing a conventional self-testing device;

FIG. 2 is a block diagram showing a self-testing device according to an embodiment of the present invention;

DETAILED DESCRIPTION OF PREFERRED EMBODIMENTS

Figure 3:
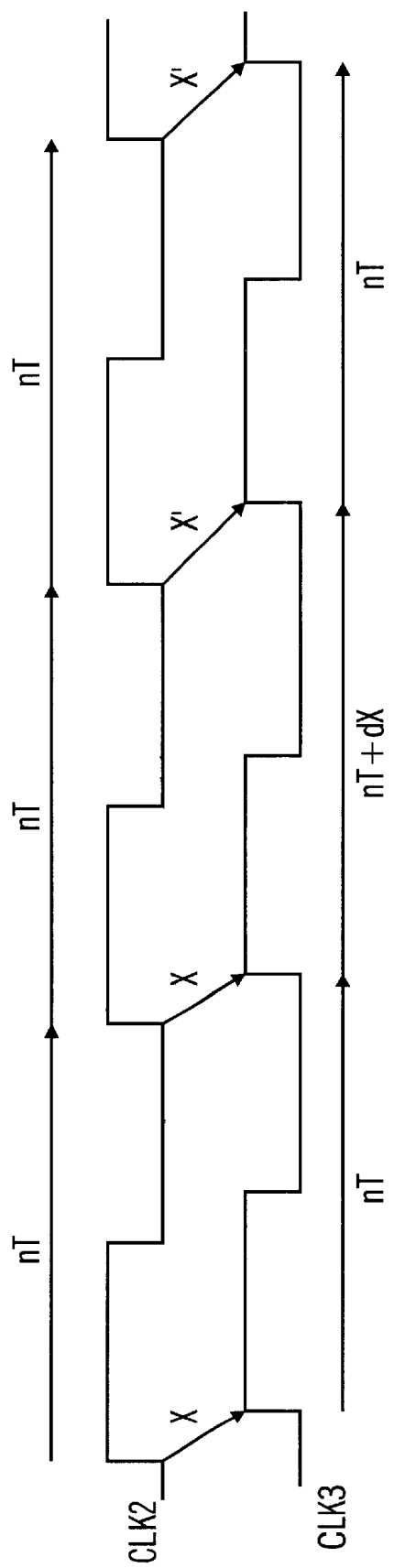
FIG. 3 is a timing diagram showing the two clock signals used in the device of FIG. 2.

Preferred embodiments of the present invention will be described in detail hereinbelow with reference to the attached drawings.

FIG. 2 shows a self-testing system according to the an embodiment of the present invention. The clock generator 9 of FIG. 2 differs from the clock generator 1 of FIG. 1. In particular, the clock generator 9 of FIG. 2 delivers two clock signals CLK2 and CLK3, with the first clock signal CLK2 being received by the transmitter 2 and the second clock signal CLK3 being received by the receiver 3. In preferred embodiments, the transmitter 2 is a generator of pseudo-random data and the receiver 3 is a logic circuit that verifies the integrity of the received data. The receiver 3 is connected to an error counter that verifies the integrity of the signals received, and the output of the transmitter 2 is connected to a first circuit 4, which is preferably a multiplexing circuit. The first circuit 4 supplies a signal to the input of a data processing circuit 7, and the data processing circuit 7 supplies a signal to the input of a second circuit 5, which is preferably a demultiplexing device, whose output is connected to the input of the receiver 3.

As in the device of FIG. 1, the output of the first circuit 4 and the input of the second circuit 5 are directly connected through a link 6, and the short-circuit is controlled by a switch 8. To divide the device into two distinct blocks, it can be said that the clock generator 9, the transmitter 2, the receiver 3, and the link 6, which makes it possible to short-circuit the data processing circuit, constitute a testing device A. The first circuit 4, the second circuit 5 and the data processing circuit 7 constitute a component or circuit to be tested B. When the switch 8 is closed, the presence of a second clock signal CLK3 that is different from the first clock signal CLK2 makes it possible to perform a self-test corresponding to real usage conditions.

More specifically, the receiver 3 can compare the binary signals coming from the second circuit 5 with those that are directly transmitted by the transmitter 2 while taking into account a clock signal different from the one used by the transmitter. Thus, any dysfunctioning in the circuit or component can be tested and thus observed under real usage conditions. The transmitter 2 and the receiver 3 receive two distinct clock signals CLK2 and CLK3 so it is possible, by controlling these two clock signals, to simulate the effects of frequency dispersion and frequency fluctuation on the tested component under conditions that are close to real operating conditions.

FIG. 3 shows timing diagrams corresponding to possible forms of the two clock signals CLK2 and CLK3. The first clock signal CLK2 represents the first clock, and the second clock signal CLK3 is obtained by delaying the first clock signal CLK2 by a variable delay X. When the delay X is kept constant for two consecutive periods of the first clock signal CLK2, the period of the second clock signal CLK3 is equal to that of the first clock signal CLK2. By changing the delay X to the value X'=X+dX, the corresponding period of the second clock signal CLK3 is changed by a value dX with respect to the corresponding period of the first clock signal CLK2. (The value dX may be positive or negative.) Consequently, the mean period of the second clock signal CLK3, and therefore the frequency of the second clock signal CLK3 changes with respect to the period and frequency of the first clock signal CLK2. Thus, by controlling the difference dX and the frequency of change of the delay X, the frequency variation between the signals CLK2 and CLK3 is controlled.

For example, if the period nT of the first clock signal CLK2 is ten nanoseconds (which corresponds to a frequency of 100 MHZ), the difference dX is equal to 20 picoseconds, and the control of the delay X is changed, at each period of the signal CLK2, the signal CLK3 will be formed by identical periods with a value of 10.02 nanoseconds. This corresponds to a frequency variation of 2% between the signals CLK2 and CLK3. Under the same assumptions, if the control of the delay X is changed every ten periods of the signal CLK2, the signal CLK3 will be formed by nine periods of two nanoseconds and one period of 10.02 nanoseconds giving a mean period of 10.002 nanoseconds. This corresponds to a frequency variation of two per ten thousand between the signals CLK2 and CLK3.

Similarly, if the delay X is increased from X to X' on the odd-parity periods (i.e., the first, third, and so on) of the signal CLK2 and if it is reduced from X' to X on the even-parity periods (i.e., the second, fourth, and so on) of the signal CLK2, then the signal CLK3 will be formed by odd-parity periods having a value of 10.02 nanoseconds and even-parity periods having a value of 9.98 nanoseconds. Thus, there is a mean period of ten nanoseconds and a fluctuation or jitter of 40 picoseconds. Thus, by causing a variation in the delays X, either by the difference between X and X' or by the frequency of these changes, a change is obtained in the amplitude of the fluctuations measured in picoseconds in the illustrated example and in the modulation frequency of these fluctuations. Thus, the robustness of the components for different frequency fluctuations of different natures can be measured.

Figure 4:
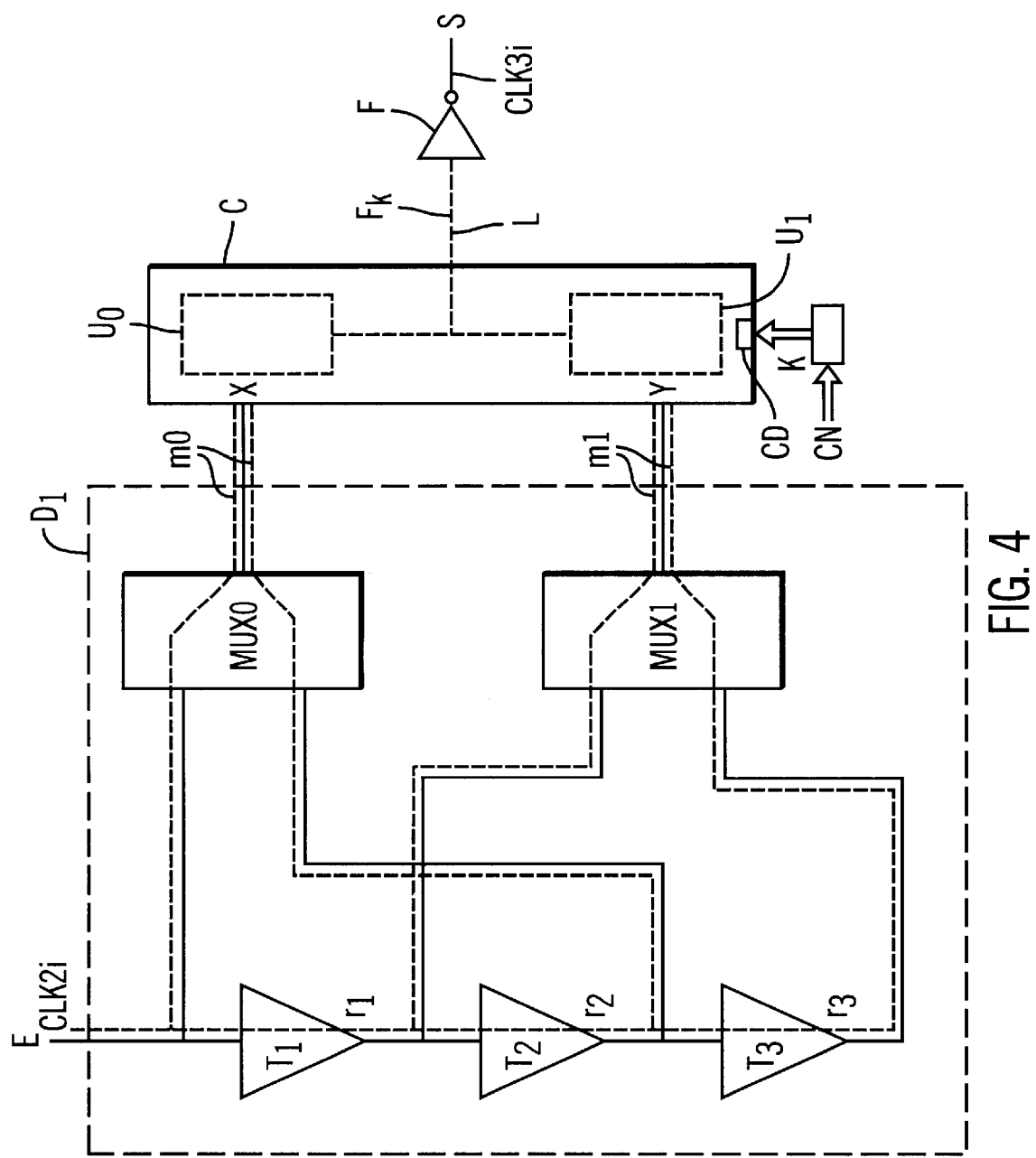
FIG. 4 is a block diagram showing a variable delay circuit used to generate the second clock signal from the first clock signal in accordance with a preferred embodiment of the present invention.

With two different oscillators, it is not possible to generate two clock signals at frequencies having very little difference with respect to each other. The dispersions between transistors of the same integrated circuit are counted in percentages and are equal to a few percent, and this is far too great to be used as the clock signals in the device of FIG. 2. Instead, the second clock signal is generated by delaying the first clock signal using a variable delay circuit. FIG. 4 shows one embodiment of such a variable delay circuit, which is designated as an elementary variable delay circuit. The circuit includes a primary fixed delay circuit D1 that receives a first intermediate clock signal CLK2$i$ and outputs first and second intermediate signals m0 and m1.

There is a fixed delay between the signals m0 and m1 supplied. The signals m0 and m1 are to inputs X and Y of a combination circuit C, which outputs a combination signal fK. The combination circuit C includes a control input CD that receives a command K representing the weighting coefficients of the combination made by the circuit C. The command K is a function of an instructed delay value CN. The combination signal fK is supplied to the input of a shaping circuit F whose output gives a second intermediate clock signal CLK3$i$. To simplify the explanation, the reasoning will be based on the standardized magnitudes of the signals involved and it will be assumed that the weighting coefficients assigned to the signals m0 and m1 are respectively the values K and 1−K with K, ranging from 0 to 1. Under these conditions, the circuit C is designed to obtain the combination gK=K×m0+(1−K)×m1 with time-related integration in order to obtain the combination signal fK from the combination gK. The signal CLK2$i$ reaches the input E of the circuit at a first buffer memory T1. In the preferred embodiment, three identical buffer memories T1, T2, and T3 are connected in series and used for the serial introduction of fixed delays to the signal CLK2$i$. Preferably, the fixed delays are all equal and equal to T so that the signal CLK2$i$ is delayed by T, 2T, 3T, etc. However, in further embodiments, the delays are different from one another. The signal r1 is provided at the output of the buffer memory T1, the signal r2 is provided at the output of the buffer memory T2, and the signal r3 is provided at the output of the buffer memory T3.

The input of the first buffer memory is connected to one of the two inputs of a first multiplexer MUX0, and the output of the second buffer memory T2 is the other input of the first multiplexer MUX0. The outputs of the first and third buffer memories T1 and T3 are connected to the two inputs of a second multiplexer MUX1. The outputs of the first and second multiplexers MUX0 and MUX1 are connected to the inputs of the combination circuit C to achieve a delay interpolation, and the output of the combination circuit supplies the signal fK to the shaping circuit F. The combination circuit is formed by two modules U0 and U1, so the interpolation can be done between either the signals CLK2$i$ and r1, the signals r2 and r1, or the signals r2 and r3.

These three combinations are the only ones to have a constant delay equal to T between the signals, and by presenting the signals of these three combinations of signals to the input of the combination circuit, it is certain that a constant delay range will be obtained. The goal of such a circuit is to obtain an optimal linearity between the digital command CN and the delay of the signal CLK3$i$ on the signal CLK2$i$. The combination of the signals CLK2$i$ and r3 is never supplied to the combination circuit because the delay between the two signals is far too great and will not meet the conditions of linearity.

Thus, several delay ranges can be placed one after the other. The placing of these delay ranges one after the other is performed by using a first combination CLK2$i$ and r1 to produce a delay that is variable between 0 and T, a second combination r1 and r2 to produce a delay that is variable between T and 2T, a third combination r2 and r3 to produce a delay that is variable between 2T and 3T, and so on. The number of buffer memories used and the capacity of the multiplexers conditions the total dynamic delay range of the delay circuits. Such a circuit is known and therefore is not described in greater detail. However, the circuit is preferably of the type described in the French patent published under number 2 690 022 and entitled "Circuit á retard variable" ("Variable Delay Circuit"). The patent relates to a variable delay circuit having optimal delay linearity between the output and input of the circuit as a function of the instructed delay value.

Figure 5:
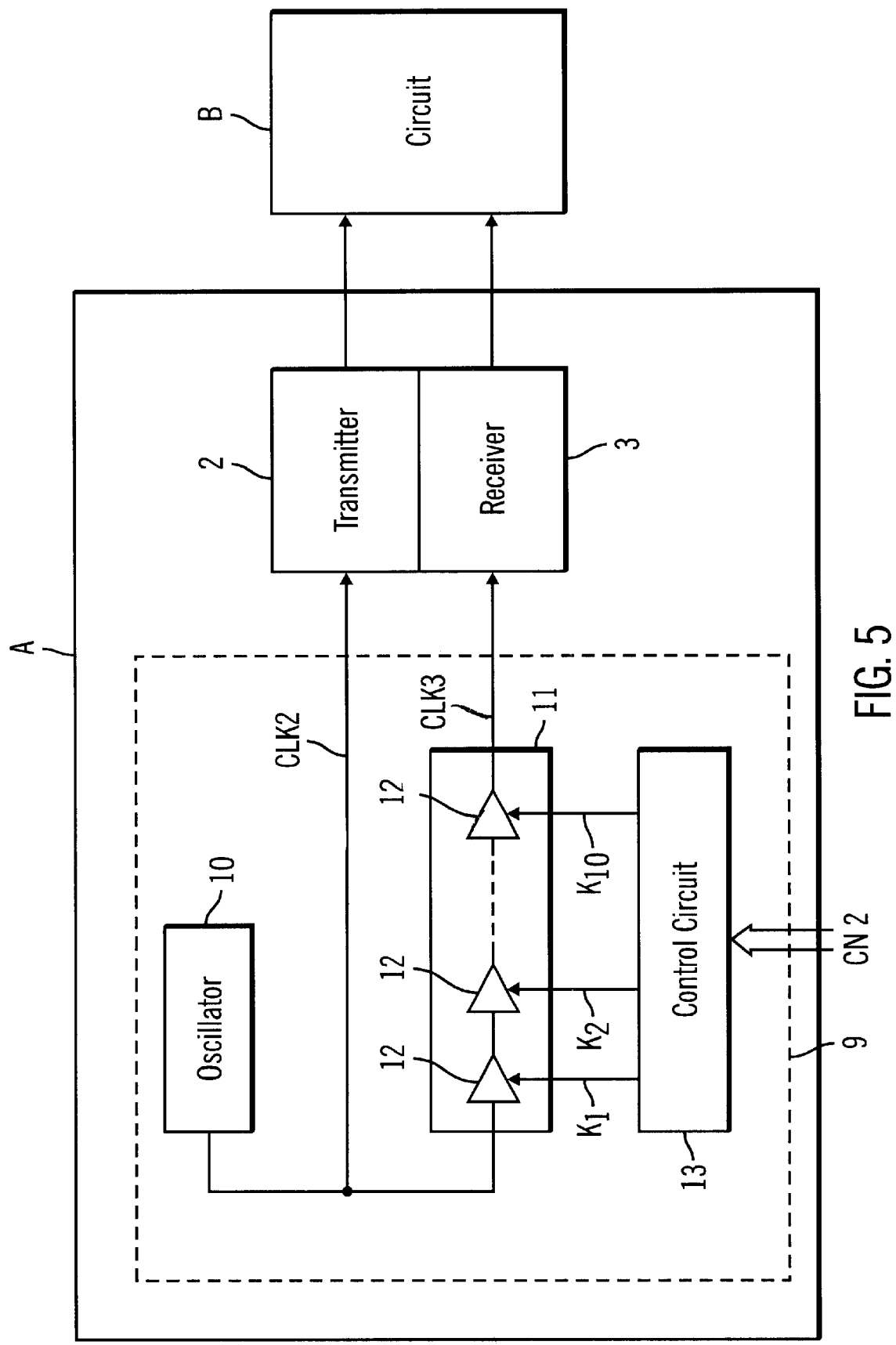
FIG. 5 is a block diagram showing a detailed view of a self-testing device according to an embodiment of the present invention.

In another preferred embodiment, the variable delay circuit described in the French patent published under number 2 689 339 and entitled "Procédé et dispositif de reglage de retard á plusieurs gammes" ("Method and Device for the Setting of Delays with Several Ranges") is used. These circuits, by providing a perfectly linear response of the delay between an input signal and an output signal as a function of an instructed digital value, cover a delay range of 1.5 nanoseconds. Such an elementary variable delay circuit is shown in the self-testing device of FIG. 5.

The clock generator 9 delivers the clock signals CLK2 and CLK3, and has an oscillator 10 that delivers the first clock signal CLK2. The first clock signal CLK2 is output from the clock generator 9 to the transmitter 2, and is also supplied to the input of the variable delay circuit 11. The variable delay circuit 11 is formed of ten elementary variable delay circuits 12 that are connected in series. The elementary variable delay circuits 12 are of the type described above with reference to FIG. 4. A control circuit 13 makes it possible, on the basis of an instructed digital value CN2, to generate control magnitudes K1, K2, and K10 to control the delays of the elementary variable delay circuits.

At the beginning of testing, the commands for the ten elementary variable delay circuits are set at the smallest value to produce a delay at the output of the variable delay circuit 11 of about 5 nanoseconds. Thus, the second clock signal CLK3 output from the variable delay circuit 11 is phase-shifted by 5 nanoseconds with respect to the first clock signal CLK2. As the testing is carried out, the value of the command K1 of the first elementary variable delay circuit 12 is gradually increased. Then, little by little, the control variables of the other elementary variable delay circuits 12 are increased. Thus, a range of propagation time between a minimum propagation time and a maximum propagation time is gradually swept through, with the maximum propagation time being about 15 nanoseconds in the illustrated embodiment.

It is valuable to have ten elementary variable delay circuits 12 in series because each of the variable delay circuits 12 accepted a linear response of the delay as a function of the digital signal for a duration of only 1.5 nanoseconds. The series connection of about ten elementary variable delay circuits 12 makes certain that, for a frequency of around 100 MHZ, it is possible to have available a propagation time greater than the period of the first clock signal CLK2. Thus, the study of the drift that may be presented by two different oscillators on the leading edges of their signals is optimal. As described above with reference to FIG. 2, the second clock signal CLK3 from the device 9 is supplied to the receiver 3.

In one preferred embodiment, the oscillator 10 is a ring oscillator formed by five elementary variable delay circuits such as those described in FIG. 4. Thus, it can also be controlled by a digital command to make it possible for greater precision to be obtained in determining the period of the first clock signal CLK2.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A testing device for testing dynamic characteristics of an electronic component or circuit using serial transmissions, the component or circuit including a multiplexing device and a demultiplexing device for implementing a serial link in the component or circuit, said testing device comprising:

a transmitter transmitting binary signals to be multiplexed to the multiplexing device, a data processing circuit being coupled to the multiplexing device; a receiver receiving the multiplexed binary signals from the demultiplexing device, the data processing circuit also being coupled to the demultiplexing device;

a link selectively providing a coupling between the transmitter and the receiver, the link including a switch; and a clock generator delivering a first clock signal and a second clock signal, which has a different frequency than the first clock signal, wherein the first clock signal is supplied to the transmitter and the second clock signal is supplied to the receiver.

2. The testing device as defined in claim 1, wherein the first clock signal and the second clock signal have frequencies of approximately 100 MHz.

3. The testing device as defined in claim 1, wherein a frequency difference between the first clock signal and the second clock signal is approximately 2 per 10,000.

4. The testing device as defined in claim 1, wherein the transmitter is a pseudo-random data generator.

5. The testing device as defined in claim 1, wherein the receiver is a logic circuit for verifying the integrity of received binary signals.

6. The testing device as defined in claim 1, wherein the clock generator includes a single programmable-frequency oscillator and a variable delay circuit, the programmable-frequency oscillator delivering the first clock signal and the variable delay circuit delaying the first clock signal to deliver the second clock signal.

7. The testing device as defined in claim 6, wherein the variable delay circuit is adjustable linearly as a function of an instructed digital value, and the delay between the first clock signal and the second clock signal can reach at least the value of one period of the first clock signal.

8. The testing device as defined in claim 6, wherein the variable delay circuit includes a plurality of elementary variable delay circuits connected in series, each elementary variable delay circuit outputs a second intermediate clock signal having a delay with respect to a first intermediate clock signal, the delay being adjustable as a function of an instructed delay value, and each of the elementary variable delay circuits includes:

a primary circuit including a set of buffer memories connected in series, each of the buffer memories delaying a signal by a delay, the first intermediate clock signal and the delayed signals being supplied to first and second multiplexers to generate first and second intermediate signals, the primary circuit outputting at least the first and second intermediate signals;

a combination circuit having two inputs that receive the first and second intermediate signals and a control input that receives the instructed delay value, the combination circuit including a common line, and first and second modules for charging and discharging the common line under the control of the first and second intermediate signals, the combination circuit outputting a combination signal that results from a superimposition with a weighting that is a function of the control magnitude and an integration effect of the first and second intermediate signals; and a shaping circuit receiving the combination signal and outputting the second intermediate clock signal based on a threshold effect.

9. A data processing system comprising:

a data processing circuit;

a multiplexing device having an output connected to an input of the data processing circuit;

a demultiplexing device having an input connected to an output of the data processing circuit;

a transmitter having an output connected to the input of the multiplexing device;

a receiver having an input connected to the output of the demultiplexing device;

a link selectively providing a coupling between the transmitter and the receiver that eliminates the data processing circuit from the data path; and a clock generator delivering a first clock signal to the transmitter and a second clock signal, which has a different frequency than the first clock signal, to the receiver.

10. The data processing system as defined in claim 9, wherein a frequency difference between the first clock signal and the second clock signal is approximately 2 per 10,000.

11. The data processing system as defined in claim 9, wherein the transmitter is a pseudo-random data generator.

12. The data processing system as defined in claim 9, wherein the receiver is a logic circuit for verifying the integrity of received signals.

13. The data processing system as defined in claim 9, wherein the clock generator includes a single programmable-frequency oscillator and a variable delay circuit, the programmable-frequency oscillator delivering the first clock signal and the variable delay circuit delaying the first clock signal to deliver the second clock signal.

14. The data processing system as defined in claim 13, wherein the variable delay circuit is adjustable linearly as a function of an instructed digital value, and the delay between the first clock signal and the second clock signal can reach at least the value of one period of the first clock signal.

15. The data processing system as defined in claim 13, wherein the variable delay circuit includes a plurality of elementary variable delay circuits connected in series, each elementary variable delay circuit outputs a second intermediate clock signal having a delay with respect to a first intermediate clock signal, the delay being adjustable as a function of an instructed delay value, and each of the elementary variable delay circuits includes:

a primary circuit including a set of buffer memories connected in series, each of the buffer memories delaying a signal by a delay, the first intermediate clock signal and the delayed signals being supplied to first and second multiplexers to generate first and second intermediate signals, the primary circuit outputting at least the first and second intermediate signals;

a combination circuit having two inputs that receive the first and second intermediate signals and a control input that receives the instructed delay value, the combination circuit including a common line, and first and second modules for charging and discharging the common line under the control of the first and second intermediate signals, the combination circuit outputting a combination signal that results from a superimposition with a weighting that is a function of the control magnitude and an integration effect of the first and second intermediate signals; and a shaping circuit receiving the combination signal and outputting the second intermediate clock signal based on a threshold effect.

16. A method of testing dynamic characteristics of an electronic circuit using a testing device, the circuit including a multiplexing device and a demultiplexing device for implementing a link in the circuit, said method comprising the steps of:

providing a testing device that includes a transmitter having an output connected to the input of the multiplexing device, and a receiver having an input connected to the output of the demultiplexing device, a data processing circuit being coupled to both the multiplexing device and the demultiplexing device;

delivering a first clock signal to the transmitter; and delivering a second clock signal, which has a different frequency than the first clock signal, to the receiver.

17. The method as defined in claim 16, wherein a frequency difference between the first clock signal and the second clock signal is approximately 2 per 10,000.

18. The method as defined in claim 16, further comprising the step of using the transmitter to generate pseudo-random data.

19. The method as defined in claim 16, further comprising the step of using the receiver to verifying the integrity of received data.

20. The method as defined in claim 16, wherein the step of delivering the first clock signal includes the sub-step of using a single programmable-frequency oscillator to generate the first clock signal, and the step of delivering the second clock signal includes the sub-step of generating the second clock signal by variably delaying the first clock signal.

21. The method as defined in claim 20, wherein the step of delivering the second clock signal includes the sub-step of linearly adjusting the variable delay as a function of an instructed digital value.

* * * * *